United States Patent
Wu et al.

(10) Patent No.: US 7,663,442 B2
(45) Date of Patent: Feb. 16, 2010

(54) DATA RECEIVER INCLUDING A TRANSCONDUCTANCE AMPLIFIER

(75) Inventors: Zuoguo Wu, Marlborough, MA (US); Feng Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 760 days.

(21) Appl. No.: 11/091,227

(22) Filed: Mar. 28, 2005

(65) Prior Publication Data

US 2006/0215787 A1 Sep. 28, 2006

(51) Int. Cl.
| | |
|---|---|
| H03F 3/04 | (2006.01) |
| H03F 1/30 | (2006.01) |
| H03F 3/217 | (2006.01) |
| H03F 3/45 | (2006.01) |
| H03F 3/26 | (2006.01) |
| H03F 3/68 | (2006.01) |
| H03M 1/66 | (2006.01) |
| H03M 1/06 | (2006.01) |
| H03M 1/12 | (2006.01) |
| H03M 1/36 | (2006.01) |
| H02M 11/00 | (2006.01) |
| H03K 17/00 | (2006.01) |
| H03L 5/00 | (2006.01) |
| H03K 3/59 | (2006.01) |
| H03K 17/90 | (2006.01) |
| G11C 7/00 | (2006.01) |
| G11C 11/00 | (2006.01) |
| G01R 33/06 | (2006.01) |
| G01N 27/72 | (2006.01) |

(52) U.S. Cl. ............... 330/290; 330/288; 330/250; 330/259; 330/270; 330/295; 330/9; 330/51; 341/159; 341/155; 341/144; 341/156; 341/118; 327/103; 327/334; 327/124; 327/307; 327/511; 365/205; 365/158; 365/171; 365/173; 365/148; 324/251; 324/225

(58) Field of Classification Search ................. None
See application file for complete search history.

(56) References Cited

U.S. PATENT DOCUMENTS

| | | | | |
|---|---|---|---|---|
| 5,194,831 | A * | 3/1993 | Jackson | 331/111 |
| 5,604,433 | A * | 2/1997 | Theus et al. | 324/251 |
| 5,896,064 | A * | 4/1999 | Kaku | 330/279 |
| 6,172,569 | B1 * | 1/2001 | McCall et al. | 330/303 |
| 6,255,979 | B1 * | 7/2001 | Allee et al. | 341/159 |
| 6,333,647 | B1 * | 12/2001 | Plagens | 327/55 |
| 6,501,282 | B1 * | 12/2002 | Dummermuth et al. | 324/679 |
| 6,600,373 | B1 * | 7/2003 | Bailey et al. | 330/260 |
| 6,697,896 | B1 | 2/2004 | Chen et al. | |
| 6,708,025 | B2 * | 3/2004 | Iwata et al. | 455/234.1 |

(Continued)

OTHER PUBLICATIONS

U.S. Appl. No. 10/879,513, filed Jun. 29, 2004, Chen et al.

Primary Examiner—Vibol Tan
Assistant Examiner—Matthew C. Tabler
(74) Attorney, Agent, or Firm—Blakely, Sokoloff, Taylor & Zafman LLP

(57) ABSTRACT

According to one embodiment, a system, apparatus, and method for receiving high-speed signals using a receiver with a transconductance amplifier is presented. The apparatus comprises a transconductance amplifier to receive input voltage derived from an input signal, a clocked current comparator to receive output current from the transconductance amplifier, and a storage element to receive a binary value from the clocked current comparator.

16 Claims, 5 Drawing Sheets

U.S. PATENT DOCUMENTS

| | | | |
|---|---|---|---|
| 6,727,768 B1 * | 4/2004 | Dasgupta | 331/143 |
| 6,829,188 B2 * | 12/2004 | Baker | 365/205 |
| 6,914,838 B2 * | 7/2005 | Baker | 365/205 |
| 6,922,044 B2 * | 7/2005 | Walters et al. | 323/288 |
| 7,129,875 B1 * | 10/2006 | Altun et al. | 341/143 |
| 2003/0043439 A1 * | 3/2003 | Vaughan et al. | 359/187 |
| 2003/0189461 A1 * | 10/2003 | Huijsing et al. | 330/9 |
| 2003/0196013 A1 | 10/2003 | Chen et al. | |

* cited by examiner

DATA RECEIVER INCLUDING A TRANSCONDUCTANCE AMPLIFIER

TECHNICAL FIELD

The embodiments of the invention relate generally to high speed input/output circuits.

BACKGROUND

In many data communication arrangements, separate clock signals are not transmitted with the data. This requires recovering the clock from the data at the receiving end in order to then recover the data itself. With rapidly developing processor technology, demands for high-speed input/output (I/O) communication arrangements are ever increasing.

However, with high-speed input/output (I/O) communication arrangements, design challenges and complexity of the I/O receiver increase significantly. Not only does the receiver have to operate at higher data rates, but also the receiver sensitivity has to be improved as well due to the shorter time length of a received signal.

One type of receiver topology has been demonstrated, and often is considered 'standard' topology. A receiver employing this 'standard' topology would include a front sampler, a variable offset comparator, and one or more flip-flops. The front sampler is used to sample the analog value of input voltages on a pair of capacitors. The variable offset comparator then compares the sampled input voltages and decides the binary value. Then, the binary value is sent or latched to the one or more flip-flops.

Yet, the use of a front sampler does not remedy the potentially adverse effects of charge injection occurring in the sampler. Charge injection refers to the effect of a charge being capacitatively coupled or injected from a digital control line to an analog signal path as an analog switch turns on and off. Such an additional charge from a switch to a capacitor may alter the stored voltage, and ultimately lead to erroneous data detection decisions.

Furthermore, in cases where a receiver uses a half-rate clock, for example, a clock of 5 GHz (gigahertz) may be used for 10 Gb/s (gigabits per second) of data. In such a case, the incoming data needs to be sampled on both clock edges and requires two parallel receivers. Under the 'standard' topology, each receiver would also require its own front sampler, as a single sampler cannot handle the data for both receivers. In such situations, each sampler would also require its own digital-to-analog converter (DAC) to provide for any offset adjustments to the local receiver clock. Such an arrangement may require substantial area and power consumption of the circuit.

BRIEF DESCRIPTION OF THE DRAWINGS

Embodiments of the invention will be understood more fully from the detailed description given below and from the accompanying drawings of various embodiments of the invention. The drawings, however, should not be taken to limit the embodiments of the invention to specific implementations, but are for explanation and understanding only.

DETAILED DESCRIPTION

A system, apparatus, and method for receiving high-speed signals using a receiver with a transconductance amplifier are described. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the embodiments of the invention may be practiced without these specific details. In other instances, well-known structures and devices are shown in block diagram form, rather than in detail, in order to avoid obscuring embodiments of the invention.

Figure 1:
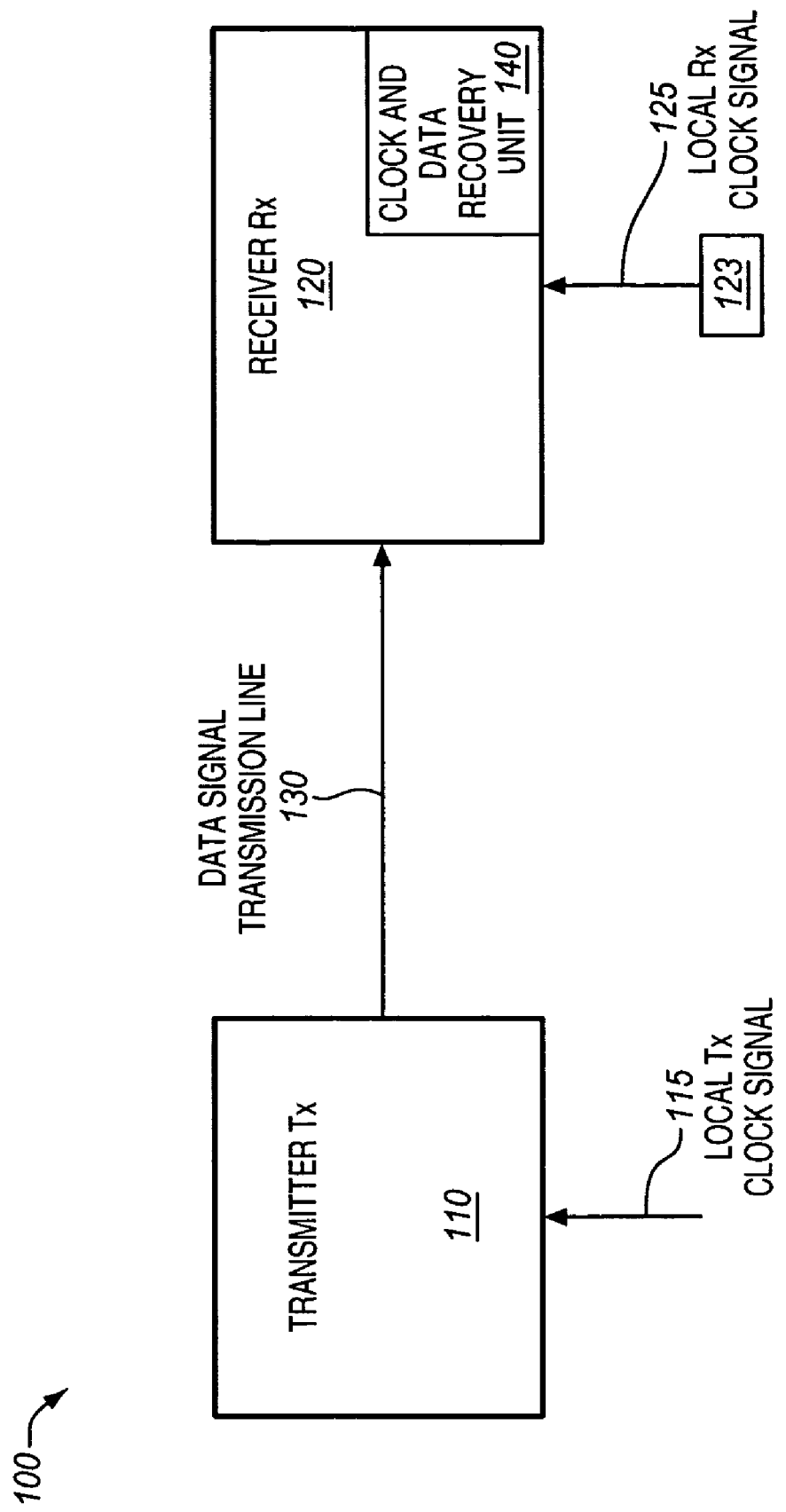
FIG. 1 illustrates a block diagram of a communication system.

FIG. 1 is a block diagram of one embodiment of a communication system 100 that may be used to receive high-speed signals using a receiver with a transconductance amplifier. The system 100 includes a transmitter (Tx) 110, a data signal transmission line 130, and a receiver (Rx) 120.

Transmitter 110 transmits a data signal over data signal transmission line 130 to receiver 120. The data signal may be generated by the transmitter 110 in accordance with a Tx clock signal 115. After the signal travels the transmission line 130 between the transmitter 110 and the receiver 120, the receiver 120 may then re-create the original data in accordance with the received signal and a local Rx clock signal 125. In some embodiments, local Rx clock signal 125 may originate from local Rx clock 123.

To accurately re-create the original data, clock and data recovery unit 140 within the receiver 120 is utilized. Clock and data recovery unit 140 tracks the clock phases of the local Rx clock signal 125 and the recovered Tx clock signal 115 as seen at the receiver 120. This is done by using the received signal to "recover" information about the Tx clock signal 115. That is, "transitions" in the received signal (i.e., from 0 to 1 or from 1 to 0) will reflect transitions in the clock phases of Tx clock signal 115. By adjusting the local Rx clock signal 125 in accordance with these Tx clock transitions, the original data may be recovered from the received signal and accurately re-created.

Figure 2:
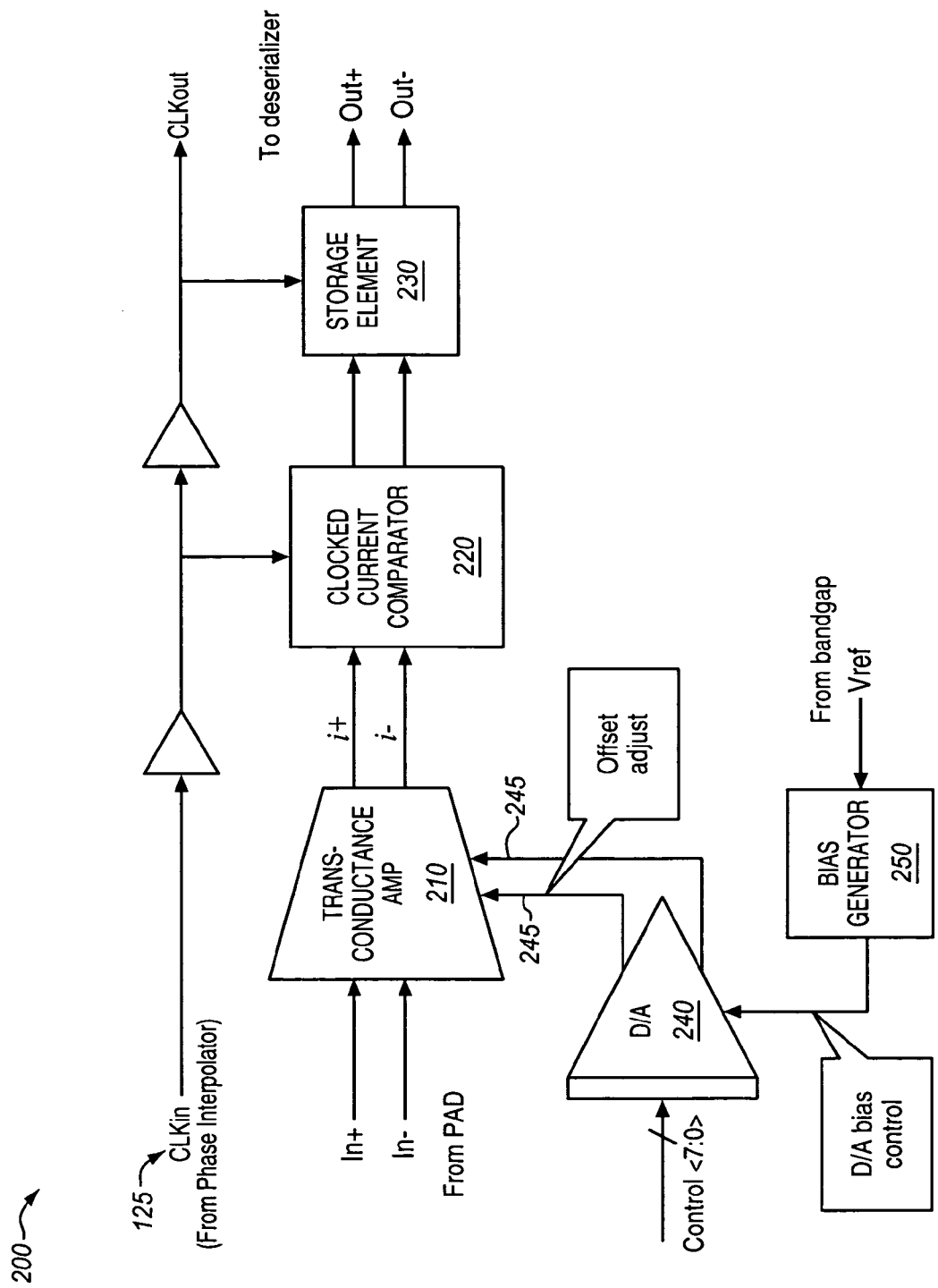
FIG. 2 illustrates a block diagram of one embodiment of a receiver.

FIG. 2 is a block diagram illustrating a receiver circuit according to one embodiment of the invention. Receiver 200, in some embodiments, may be receiver 120 of FIG. 1. Furthermore, some embodiments of the invention may be implemented as clock and data recovery unit 140 of receiver 120.

In one embodiment, receiver 200 utilizes a wide-band transconductance amplifier 210 as the first stage on the front end of the receiver circuit. Input differential voltage from In+ and In− are converted to differential current by the transconductance amplifier 210.

The second stage of the receiver 200 is a high-speed current comparator 220. The current comparator 220 receives the differential current output from the transconductance amplifier 210. The current comparator 220 is clocked by a local receiver clock signal 125 so that input data and transmitter clock phase information can be recovered. The output of the comparator 220 is then sent to storage element 230. In some embodiments, storage element 230 may be a high-speed flip-flop or latch.

As current, rather than voltage, is passed from the transconductance amplifier 210 to the current comparator 220 of the receiver circuit, low input impedance is used for the current comparator 220. This low impedance may increase the bandwidth of the combined stages.

Compared with existing topology utilized in high-speed input/output receiver circuits, the receiver circuit of embodiments of the invention eliminates the need for a front sampler. Without a sampler, the effect of charge injection, which can potentially affect the receiver sensitivity, should be greatly reduced. This topology may also have less latency than a standard sampler topology.

Continuing to refer to FIG. 2, an offset correction feature may be implemented by the front-end transconductance amplifier 210. Such an offset feature adjusts the signal to avoid potential bit errors. A digital-to-analog converter (DAC) 240 is used to adjust the offset amount, and a bias generator 250 that may be shared among receivers is used to control the bias of the DAC 240. Offset adjustment inputs 245 are sent to the transconductance amplifier 210 to adjust the signal.

Figure 3:
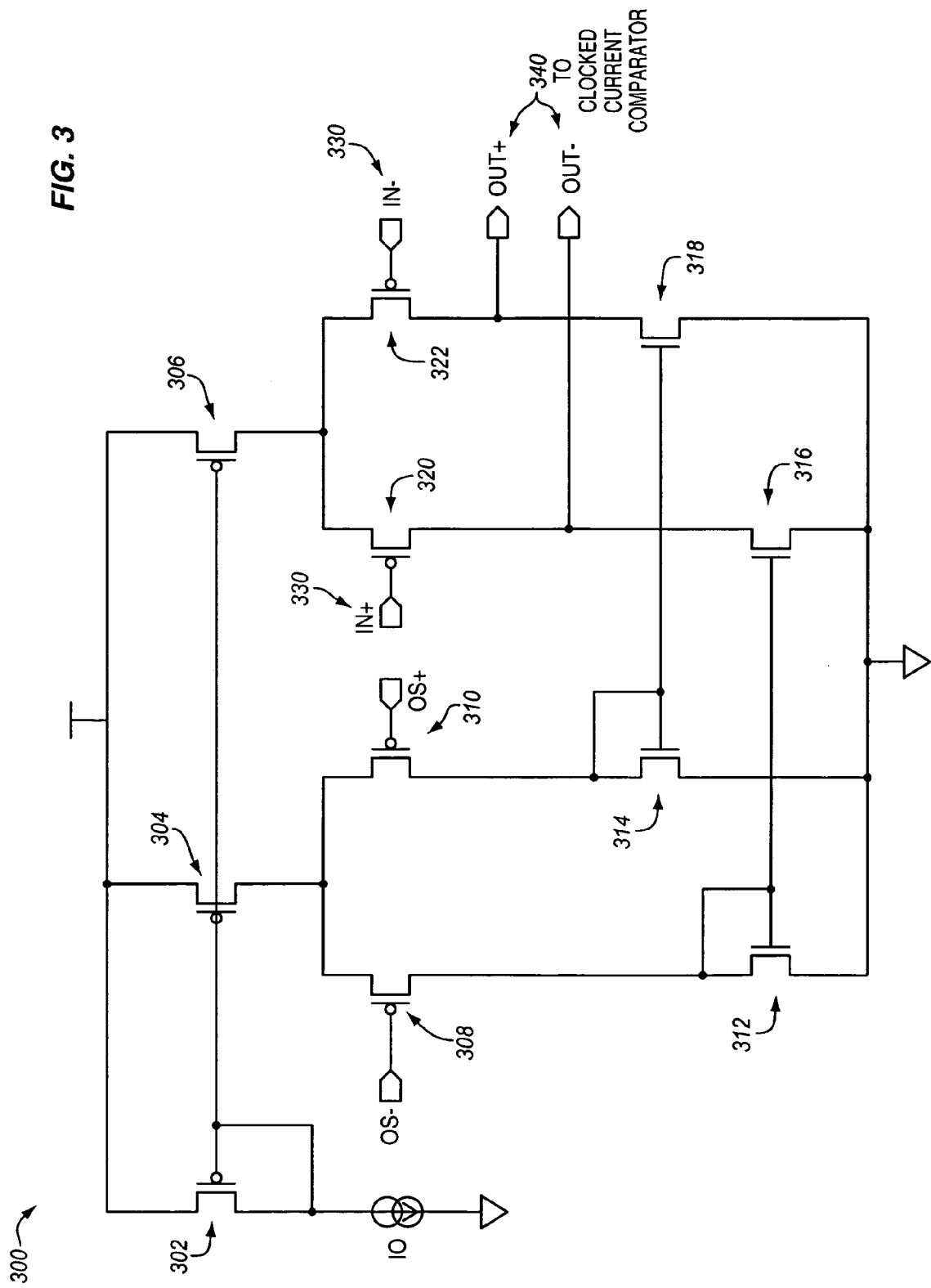
FIG. 3 illustrates a circuit diagram of one embodiment of a transconductance amplifier.

Referring now to FIG. 3, one embodiment of a circuit diagram of a transconductance amplifier is shown. In one embodiment, transconductance amplifier 300 may be the same as transconductance amplifier 210 of FIG. 2. Transconductance amplifier 300 includes transistors 302-322, input terminals 330, and output terminals 340.

The circuit diagram of transconductance amplifier 300 is only one possible implementation of a transconductance amplifier. One skilled in the art will appreciate that there are a variety of implementations for a transconductance amplifier, and that FIG. 3 is by no means limiting the circuitry of a transconductance amplifier to such a configuration.

Figure 4:
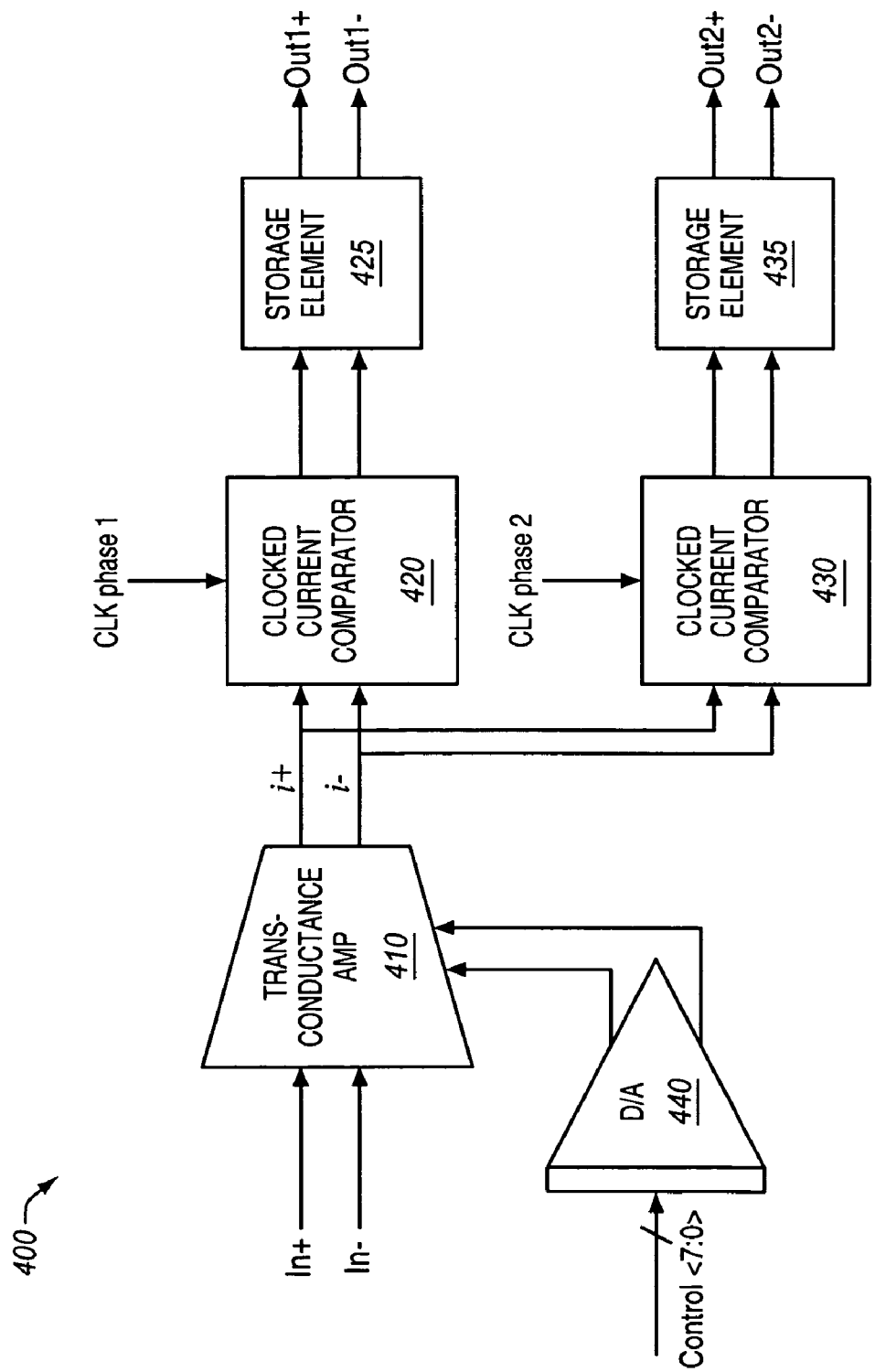
FIG. 4 illustrates a block diagram of another embodiment of a receiver.

Referring now to FIG. 4, a block diagram of another embodiment of a high-speed I/O receiver circuit is shown. In high-speed I/O circuits, a half-rate clock may be used due to the data rate. For example, a clock of 5 GHz may be used for 10 Gb/s data rate. In such a case, the incoming data needs to be sampled at both clock edges, and therefore two parallel receivers are needed.

The transconductor topology of embodiments of the invention makes it possible for two receivers to share the same front-end stage, as shown in FIG. 4. Receiver circuit 400 includes a transconductance amplifier 410 and an offset adjustment unit including a DAC 440, similar to the arrangement of FIG. 2. But, the receiver circuit 400 includes two clock current comparators 420, 430 for each receiver, to recover data and clock phase information. It also includes two storage elements 425, 435 for each receiver. In some embodiments, different storage elements 425, 435 may be high-speed flip-flops or latches.

The arrangement of receiver circuit 400 allows multiple receivers to share the transconductance amplifier 410 and offset adjustment unit including the DAC 440. In the 'standard' topology with a front sampler, there would be a front sampler and DAC unit for each receiver. The arrangements of embodiments of the invention reduce area and power consumption on the chip because fewer components are required. One skilled in the art will appreciate that the arrangement of receiver circuit 400 may be expanded to encompass more than two receivers as was depicted in FIG. 4.

Figure 5:
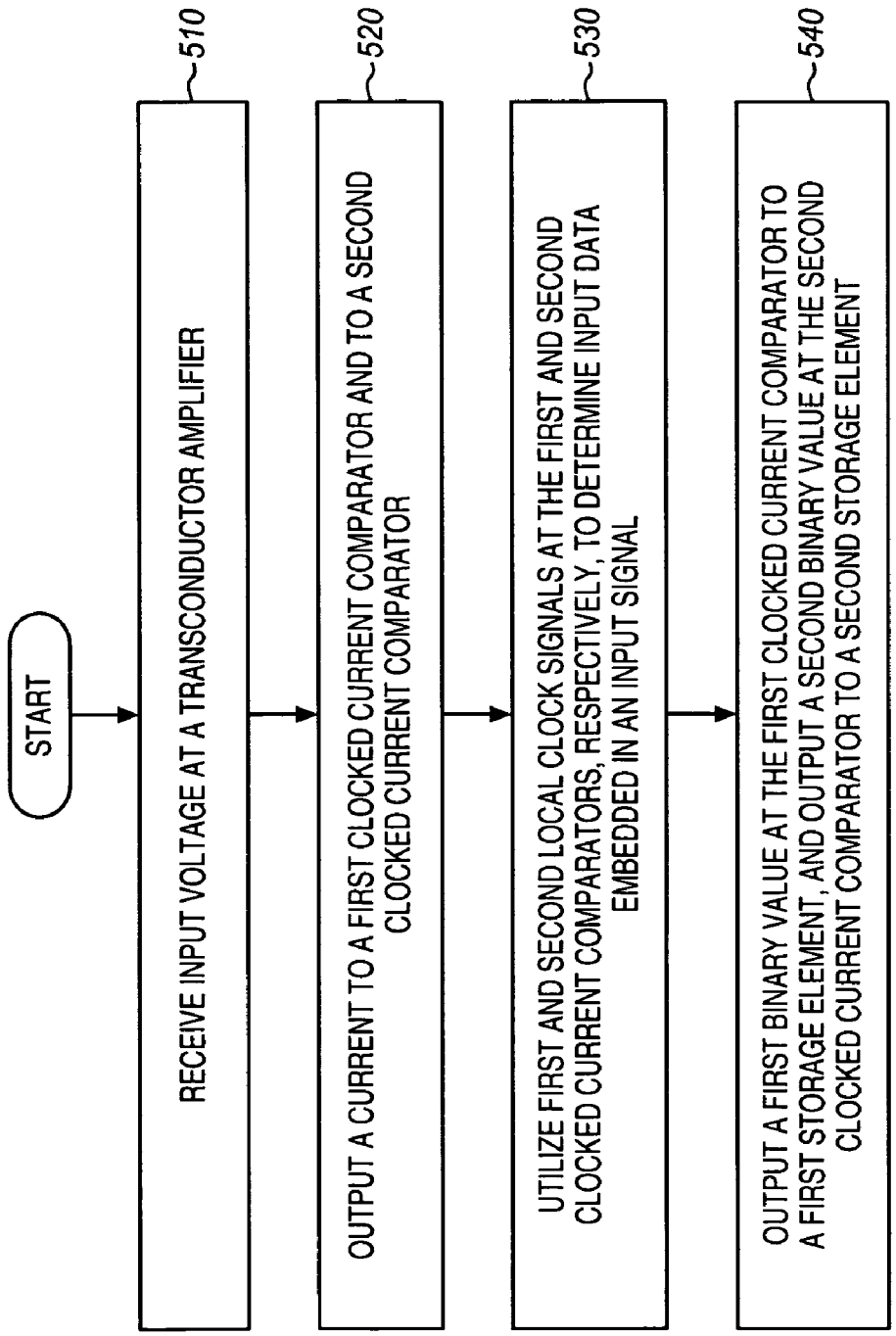
FIG. 5 is a flow diagram depicting a method according to one embodiment of the invention.

Referring now to FIG. 5, a flow diagram depicting a method to receive high-speed signals using a receiver with a transconductance amplifier is shown. At processing block 510, an input voltage is received at a transconductance amplifier. Then, at processing block 520, the transconductance amplifier outputs a current to a first clocked current comparator, and in some embodiments, outputs the current to a second clocked current comparator.

At processing block 530, the first clocked current comparator utilizes a first local clock signal to determine input data and clock phase information embedded in the input signal. In some embodiments, the second clocked current comparator utilizes a second local clock signal to determine input data and clock phase information embedded in the input signal. Then, at processing block 540, the first clocked current comparator outputs a binary value to a first storage element, and in some embodiments, the second clocked current comparator outputs a binary value to a second storage element.

The receiver circuit of embodiments of the invention is configured so that the normal operation of the clocked current comparator is not interfered with by the presence of another comparator. Furthermore, as this configuration reduces the number of DACs, it can potentially provide significant power and circuit area savings.

Embodiments of the data receiver presented here may provide the potential benefit of improved sensitivity, which results in higher bandwidth for a given silicon process and voltage. Furthermore, other potential benefits include lower power and area consumption resulting from the transconductance amplifier sharing.

Embodiments of the invention may be implemented in a variety of integrated processing circuits. Embodiments of the invention may also be utilized in serial interfaces, such as PCI Express. However, the embodiments of the receiver circuitry presented here are also useful in any arrangement where serial data transfer over a network system is desired.

Whereas many alterations and modifications of embodiments of the invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. An apparatus, comprising:
    a transconductance amplifier to receive input voltage from an input signal;
    a clocked current comparator to receive output current from the transconductance amplifier, wherein the clocked current comparator utilizes a local clock signal to determine input data and clock phase information embedded in the input signal;
    a storage element to receive the local clock signal and a binary value from the clocked current comparator; and
    an offset adjustment unit to provide signal adjustments to the transconductance amplifier in order to avoid potential bit errors, the offset adjustment unit including a digital-to-analog converter and a bias generator.

2. The apparatus of claim 1, wherein the transconductance amplifier reduces the effect of charge injection on the apparatus.

3. The apparatus of claim 2, wherein the input voltage is a differential input voltage.

4. The apparatus of claim 1, further comprising:
    another clocked current comparator to receive output current from the transconductance amplifier; and
    another storage element to receive a binary value from the other clocked current comparator.

5. The apparatus of claim 4, wherein the other clocked current comparator utilizes a local clock signal to determine input data and clock phase information embedded in an input signal.

6. The apparatus of claim 4, wherein the storage element and the other storage element are flip-flops.

7. A method, comprising:
receiving an input voltage from an input signal at a transconductance amplifier;
receiving, at the transconductance amplifier, a signal adjustment from an offset adjustment unit in order to avoid potential bit errors, the offset adjustment unit including a digital-to-analog converter and a bias generator;
outputting a current at the transconductance amplifier to a clocked current comparator, wherein the clocked current comparator utilizes a local clock signal to determine input data and clock phase information embedded in the input signal; and
outputting a binary value at the clocked current comparator to a storage element.

8. The method of claim 7, further comprising the transconductance amplifier reducing the effect of charge injection.

9. The method of claim 7, further comprising:
outputting the current at the transconductance amplifier to another clocked current comparator; and
outputting a binary value at the other clocked current comparator to another storage element.

10. The method of claim 9, further comprising utilizing a local clock signal at the other clock current comparator to determine input data and clock phase information embedded in the input signal.

11. The method of claim 7, wherein the input voltage is a differential input voltage.

12. A system, comprising:
a local reference clock providing a plurality of clock phases;
a clock and data recovery unit to receive a data signal from a transmitter, including:
a transconductance amplifier to receive input voltage from an input signal;
a clocked current comparator clocked by the local reference clock to receive output current from the transconductance amplifier, wherein the clocked current comparator utilizes a local clock signal to determine input data and clock phase information embedded in the input signal;
a storage element to receive the local clock signal and a binary value from the clocked current comparator; and
an offset adjustment unit to provide signal adjustments to the transconductance amplifier in order to avoid potential bit errors, the offset adjustment unit including a digital-to-analog converter and a bias generator.

13. The system of claim 12, wherein the transconductance amplifier reduces the effect of charge injection on the clock and data recovery unit.

14. The system of claim 12, further comprising:
another clocked current comparator to receive output current from the transconductance amplifier; and
another storage element to receive a binary value from the other clocked current comparator.

15. The system of claim 14, wherein the other clocked current comparator utilizes the local reference clock to determine input data and clock phase information embedded in the input signal.

16. The system of claim 14, wherein the storage element and the other storage element are flip-flops.

* * * * *